(12) United States Patent
Cheng et al.

(10) Patent No.: US 10,073,653 B2
(45) Date of Patent: *Sep. 11, 2018

(54) SOLID STATE DISK

(71) Applicant: ALSON TECHNOLOGY LIMITED, Kowloon (HK)

(72) Inventors: Han-Hung Cheng, Zhubei (TW); Chi-Fen Kuo, Zhubei (TW)

(73) Assignee: Alson Technology Limited, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 15/649,265

(22) Filed: Jul. 13, 2017

(65) Prior Publication Data

US 2017/0308323 A1    Oct. 26, 2017

Related U.S. Application Data

(63) Continuation-in-part of application No. 14/955,953, filed on Dec. 1, 2015, now abandoned.

(51) Int. Cl.
*G08B 17/00* (2006.01)
*G06F 3/06* (2006.01)

(52) U.S. Cl.
CPC .......... *G06F 3/0653* (2013.01); *G06F 3/0604* (2013.01); *G06F 3/0679* (2013.01)

(58) Field of Classification Search
CPC ..... G06F 3/0653; G06F 3/0604; G06F 3/0679
USPC ........................................................ 340/584
See application file for complete search history.

(56) References Cited

U.S. PATENT DOCUMENTS

| | | | |
|---|---|---|---|
| 7,771,215 B1 | 8/2010 | Ni et al. | |
| 9,363,005 B2 | 6/2016 | Mahe et al. | |
| 2003/0136849 A1* | 7/2003 | Adelmann | G06F 3/0605 235/492 |
| 2008/0074068 A1 | 3/2008 | Takeuchi | |
| 2008/0273300 A1* | 11/2008 | Wang | G06F 1/187 361/679.33 |
| 2009/0089492 A1 | 4/2009 | Yoon et al. | |
| 2009/0293189 A1 | 12/2009 | Somerville | |
| 2010/0124041 A1* | 5/2010 | Druchinin | G03B 11/00 362/16 |
| 2012/0150482 A1 | 6/2012 | Yildizyan et al. | |
| 2013/0145054 A1* | 6/2013 | Kozlovsky | G06F 11/0727 710/19 |

(Continued)

FOREIGN PATENT DOCUMENTS

TW    M508102 U    9/2015

*Primary Examiner* — Brian Zimmerman
*Assistant Examiner* — Thang Tran
(74) *Attorney, Agent, or Firm* — Muncy, Geissler, Olds & Lowe, P.C.

(57) ABSTRACT

A solid state disk, including a main body, a processing unit, a display screen and a transmit port. The main body has a substrate and a shell portion covering on two opposite side faces of the substrate, the substrate is provided with a memory module; the processing unit is disposed in the main body; the display screen is attached to the main body and viewable from outside of the solid state disk, the display screen is electrically connected with the processing unit, the processing unit can control a display state of the display screen; and the transmit port is disposed on the substrate, and the transmit port is electrically connected with the memory module.

10 Claims, 3 Drawing Sheets

(56) References Cited

U.S. PATENT DOCUMENTS

| | | | |
|---|---|---|---|
| 2014/0006603 A1* | 1/2014 | Yang | G06F 11/3034 709/224 |
| 2014/0136903 A1 | 5/2014 | Hyde et al. | |
| 2014/0372778 A1* | 12/2014 | Tian | G06F 1/08 713/322 |
| 2015/0106553 A1* | 4/2015 | Kim | G06F 3/0679 711/103 |
| 2015/0112456 A1* | 4/2015 | Sikora | F24F 11/0086 700/83 |
| 2015/0120874 A1* | 4/2015 | Kim | H04L 67/1097 709/218 |
| 2015/0324003 A1 | 11/2015 | Kang et al. | |
| 2016/0070493 A1* | 3/2016 | Oh | G06F 3/0622 711/103 |
| 2016/0132074 A1 | 5/2016 | Kim et al. | |
| 2016/0155933 A1* | 6/2016 | Kim | H01L 43/08 711/104 |
| 2016/0348883 A1 | 12/2016 | Kuo | |
| 2017/0025400 A1* | 1/2017 | Khalaf | H01L 25/18 |
| 2017/0308325 A1* | 10/2017 | Pearson | G06F 3/0658 |

* cited by examiner

SOLID STATE DISK

The present invention is a CIP of application Ser. No. 14/955,953, filed Dec. 1, 2015, the entire contents of which are hereby incorporated by reference.

BACKGROUND OF THE INVENTION

Field of the Invention

Description of the Prior Art

A solid state disk as disclosed in TWM508102 includes a substrate, a flash memory module, at least one light-emitting diode and at least one light-guiding portion. The substrate has a transmit port; the flash memory module is assembled to the substrate, and the flash memory module and the transmit port are electrically connected with each other; the at least one light-emitting diode is disposed on the substrate, and the at least one light-emitting diode and the transmit port are electrically connected with each other; and the at least one light-guiding portion at least partially covers the at least one light-emitting diode.

When in actual practice, the light-emitting diode of the conventional solid state disk has limited variations.

In addition, when the memory does not function normally, a user is unable to know the state of the memory (for example, capacity and temperature) from the appearance of the memory to find out the cause.

US20150120874 does not teach "a display screen, attached to the main body and viewable from outside of the solid state disk, electrically connected with the processing unit, the processing unit being able to control a display state of the display screen". As a result, the solid state disk has no interaction (sensing and control signal) with a display screen.

US20150112456 discloses that a wall module for use with a building control system but not "solid state disk". The display screen of the wall module is for displaying conditions of the building or air qualities which are irrelevant with conditions on or from the solid state disk. Additionally, the display screen of the wall module does not disclose that the display screen shows the conditions of the building or air qualities in different colors at the same time. Generally and reasonably, the display screen shows the conditions of the building or air qualities in single color.

US20130145054 discloses that the display is fixed to the case of the data storage system and not detachable, so that it is not easy to assemble or replace.

The present invention has arisen to mitigate and/or obviate the afore-described disadvantages.

SUMMARY OF THE INVENTION

The major object of the present invention is to provide a solid state disk, wherein compared with a conventional light-emitting diode, a display screen can show various states (for example, different pattern variations) according to a processing unit, and the solid state disk is more pleasant to the eye.

In addition, the pattern variations on the display screen allow a user to know the state of the solid state disk conveniently.

To achieve the above and other objects, a solid state disk is provided, including a main body, a processing unit, a display screen and a transmit port. The main body has a substrate and a shell portion covering two opposite side faces of the substrate, the substrate is provided with a memory module; the processing unit is disposed in the main body; the display screen is attached to the main body and is viewable from outside of the solid state disk, the display screen and the processing unit are electrically connected with each other, the processing unit can control a display state of the display screen; and the transmit port is disposed on the substrate, and the transmit port is electrically connected with the memory module.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
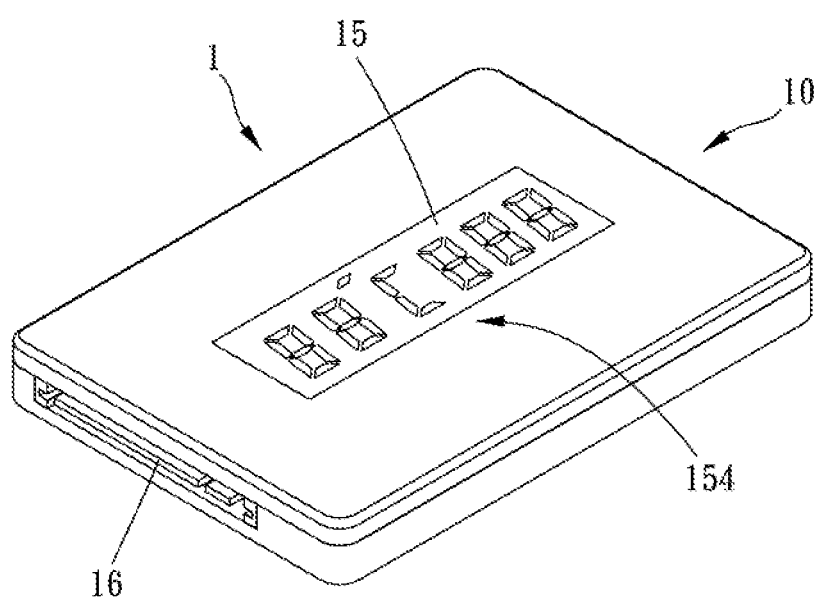
FIG. 1 is a perspective view of a preferred embodiment of the present invention.
Figure 2:
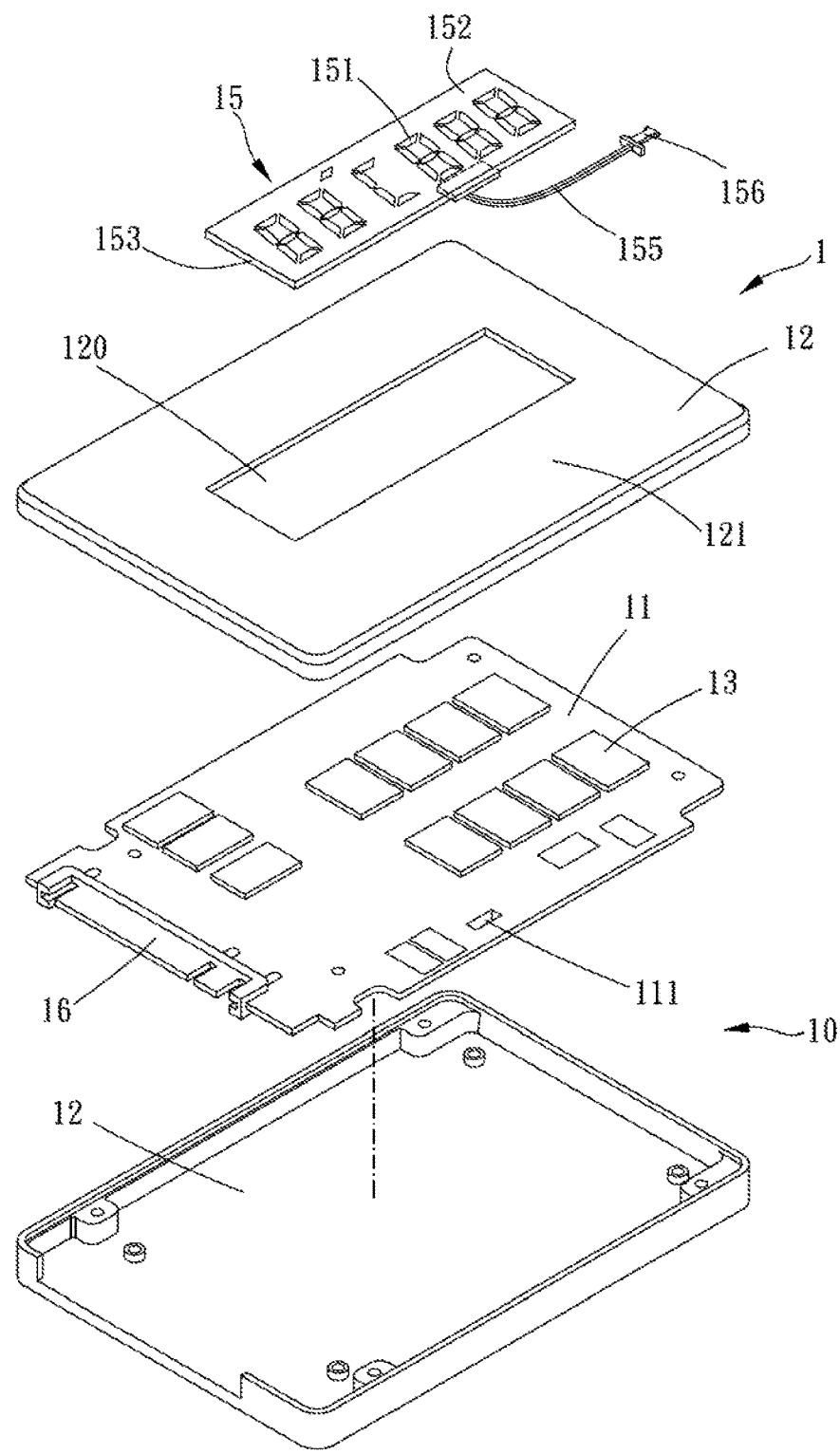
FIG. 2 is a breakdown view of the preferred embodiment of the present invention.
Figure 3:
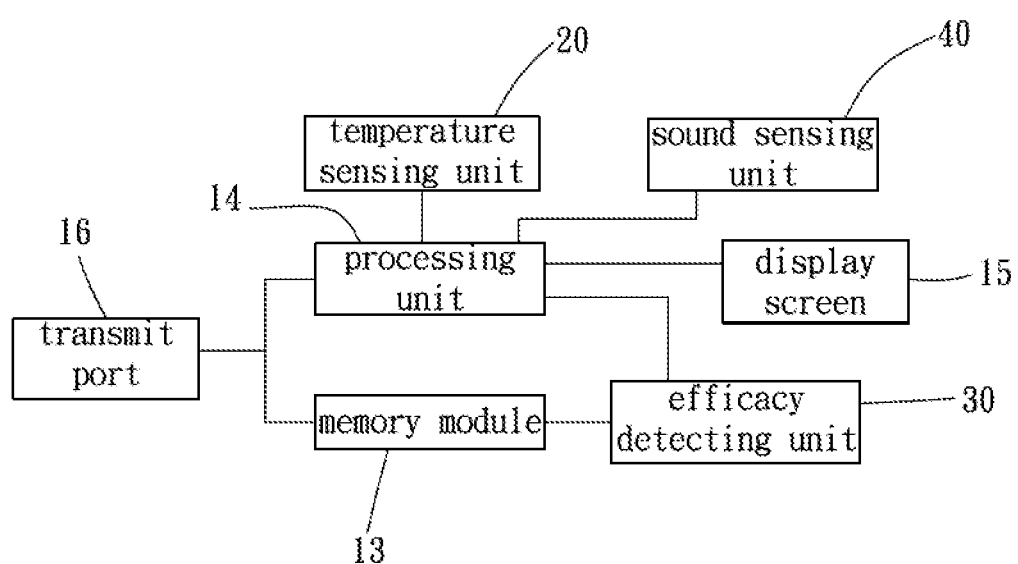
FIG. 3 is a diagram showing a structural relationship of the preferred embodiment of the present invention.

Please refer to FIGS. 1 to 3 for a preferred embodiment of the present invention. A solid state disk 1 includes a main body 10, a processing unit 14, a display screen 15 and a transmit port 16.

The main body 10 has a substrate 11 and a shell portion 12 covering two opposite side faces of the substrate 11, the substrate 11 is provided with a memory module 13, and the processing unit 14 is disposed in the main body 10.

In this embodiment, the transmit port 16 is disposed on the substrate 11, and the transmit port 16 is electrically connected with the memory module 13. More specifically, to cooperate with different insert slots in different specifications, the transmit port 16 may be a USB, a SATA or an IDE transmit port.

The display screen 15 is attached to the main body 10 and is viewable from outside of the solid state disk 1, the display screen 15 and the processing unit 14 are electrically connected with each other, and the processing unit 14 can control a display state (for example, a temperature state or an efficacy state of the solid state disk 1) of the display screen 15. In this embodiment, the shell portion 12 includes a flat mounting board 121, the flat mounting board 121 is further provided with a hollow-out portion 120, and the display screen 15 includes a printed circuit board 153, the printed circuit board 153 is flat and is engaged and embedded within the hollow-out portion 120, the flat mounting board 121 and the printed circuit board 153 are the same in thickness, and the flat mounting board 121 and the printed circuit board 153 are aligned with each other to form a combination flat solid panel 154; in other embodiments, the display screen may be disposed on the substrate, the shell portion may be provided with a light-transmittable portion (the light-transmittable portion may be a hollow-out structure or a layer made of a light-transmittable material) so that the display screen can be viewed from the light-transmittable portion (the display screen may also be arranged between the shell portion and the substrate).

The substrate 11 further includes an electric insert slot 111, the display screen 15 further includes an electric cable 155 electrically connected to the printed circuit board 153 and having an electric insert head 156, the electric insert head 156 is detachably electrically connected to the electric insert slot 111, and the electric cable 155 is longer than a width of the printed circuit board 153.

In this embodiment, the processing unit 14 is electrically connected with the transmit port 16, and the substrate 11 is a circuit board; therefore, the processing unit 14 and the transmit port 16 can be electrically connected with each other through a circuit embedded in the substrate 11. In other embodiments, the processing unit may be connected with other exterior powers (for example, a mother board) directly instead of being electrically connected with the transmit port.

The display screen 15 includes a pattern portion 151 and a background portion 152, the processing unit 14 can control color states of the pattern portion 151 and the background portion 152 respectively, and the pattern portion 151 and the background portion 152 are, at the same time, in different colors; therefore, the display screen 15 can show a state of the solid state disk 1 through patterns or words. In this embodiment, the display screen 15 is an organic light-emitting diode (OLED) display screen; however the display screen 15 may be an active-matrix OLED (AMOLED), passive matrix OLED (PMOLED) or super AMOLED which is pliable and thin. It is understandable that the display screen may be a digital, liquid crystal display, thin-film transistor, hot cathode fluorescent lamp or cold cathode fluorescent lamp display screen.

In this embodiment, the processing unit 14 is electrically connected with a temperature sensing unit 20, the temperature sensing unit 20 can sense a temperature of at least one of the substrate 11, the memory module 13 and the display screen 15 to produce a sensing signal, and the processing unit 14 can control the display screen 15 to show a temperature state according to the sensing signal. Specifically, the processing unit 14 can control the pattern portion 151 of the display screen 15 to show a number or a symbol of the temperature and control the background portion 152 to show different background colors (or flashing states) according to different temperature sections.

In addition, the processing unit 14 is further electrically connected with a sound sensing unit 40, the sound sensing unit 40 can sense a sound to produce a sensing signal, and the processing unit 14 can control the display state of the display screen 15 according to the sensing signal. For example, the processing unit 14 can control the pattern portion 151 of the display screen 15 to show a number or a symbol of a volume (or a tune) according to an intensity of the volume (or the tune) and control the background portion 152 to show different background colors (or flashing states) according to different volumes (or tunes); or the user can speak specific words (which have different sound waves) to the sound sensing unit 40 and make the processing unit 14 control the display state (patterns, colors or flashes) of the display screen 15.

The solid state disk 1 is further provided with an efficacy detecting unit 30, the efficacy detecting unit 30 is electrically connected with the processing unit 14 and the memory module 13, the efficacy detecting unit 30 can detect an efficacy condition of the memory module 13 to produce an efficacy signal, and the processing unit 14 can control the display screen 15 to show an efficacy state according to the efficacy signal. More specifically, the efficacy detecting unit 30 can detect a capacity of the memory module 13, the efficacy signal is a capacity detecting signal, and the processing unit 14 can control the display screen 15 to show a capacity state according to the capacity detecting signal so that the user can view the state of the memory module 13 from outside without operating a computer. In addition, the efficacy detecting unit 30 can further detect a reading speed of the memory module 13, the efficacy signal is a reading speed detecting signal, and the processing unit 14 can control the display screen 15 to show a reading speed state according to the reading speed detecting signal. It is to be noted that in addition to the pattern portion 151 which can show the reading speed state, the background portion 152 can produce colors or flashing states in accordance with different reading speeds.

Specifically, in other embodiments, the processing unit may not be electrically connected with the above-mentioned detecting units or sensing units, and the processing unit can control the display screen to show patterns corresponding to a preset programming built in the processing unit.

Given the above, compared with a traditional plasma tube, the display screen of the solid state disk can show various display states according to the processing unit.

In addition, through the pattern variations of the display screen, the user can know the state of the solid state disk conveniently and precisely.

While we have shown and described various embodiments in accordance with the present invention, it should be clear to those skilled in the art that further embodiments may be made without departing from the scope of the present invention.

What is claimed is:

1. A solid state disk, including:
   a main body, having a substrate and a shell portion covering two opposite side faces of the substrate, the substrate provided with a memory module;
   a processing unit, disposed in the main body;
   a display screen, attached to the main body and viewable from outside of the solid state disk, electrically connected with the processing unit, the processing unit being able to control a display state of the display screen;
   a transmit port, disposed on the substrate and electrically connected with the memory module;
   wherein the display screen includes a pattern portion and a background portion, the processing unit controls color states of the pattern portion and the background portion respectively, according to a sensing signal sensed and transmitted to the processing unit, and the pattern portion and the background portion are, at the same time, in different colors;
   wherein the shell portion includes a flat mounting board, the display screen includes a printed circuit board, the printed circuit board is flat and is engaged and embedded within the flat mounting board, the flat mounting board and the printed circuit board are the same in thickness, and the flat mounting board and the printed circuit board are aligned with each other to form a combination flat solid panel;
   wherein the substrate further includes an electric insert slot, the display screen further includes an electric cable electrically connected to the printed circuit board and having an electric insert head, the electric insert head is detachably electrically connected to the electric insert slot, and the electric cable is longer than a width of the printed circuit board.

2. The solid state disk of claim 1, wherein the processing unit is electrically connected with a sound sensing unit, the sound sensing unit is able to sense a sound to produce the sensing signal, and the processing unit is able to control the display state of the display screen according to the sensing signal.

3. The solid state disk of claim 1, wherein the processing unit is electrically connected with a temperature sensing unit, the temperature sensing unit is able to sense a temperature of at least one of the substrate, the memory module and the display screen to produce the sensing signal, and the processing unit is able to control the display screen to show a temperature state according to the sensing signal.

4. The solid state disk of claim 1, further provided with an efficacy detecting unit, the efficacy detecting unit electrically connected with the processing unit and the memory module, the efficacy detecting unit being able to detect an efficacy condition of the memory module to produce an efficacy signal which serves as the sensing signal, the processing unit being able to control the display screen to show an efficacy state according to the efficacy signal.

5. The solid state disk of claim 4, wherein the efficacy detecting unit is able to detect a capacity of the memory module, the efficacy signal is a capacity detecting signal, and the processing unit is able to control the display screen to show a capacity state according to the capacity detecting signal.

6. The solid state disk of claim 4, wherein the efficacy detecting unit is able to detect a reading speed of the memory module, the efficacy signal is a reading speed detecting signal which serves as the sensing signal, and the processing unit is able to control the display screen to show a reading speed state according to the reading speed detecting signal.

7. The solid state disk of claim 1, wherein the transmit port is a USB, a SATA or an IDE transmit port.

8. The solid state disk of claim 1, wherein the flat mounting board is provided with a hollow-out portion, and the printed circuit board is embedded in the hollow-out portion.

9. The solid state disk of claim 1, wherein the processing unit controls the pattern portion to show a number or a symbol of the temperature and controls the background portion to show different background colors or flashing states according to different temperature sections, and the pattern portion and the background portion are in different colors.

10. The solid state disk of claim 9, wherein the display screen is an organic light-emitting diode (OLED) display screen.

* * * * *